United States Patent [19]

Wilson

[11] 4,004,221
[45] Jan. 18, 1977

[54] TEST DEVICE AND METHOD OF CHECKING CIRCUITRY

[75] Inventor: Marvin T. Wilson, Glendale, Ky.
[73] Assignee: General Electric Company, Louisville, Ky.
[22] Filed: Dec. 19, 1974
[21] Appl. No.: 534,556
[52] U.S. Cl. .................. 324/158 R; 324/73 R; 324/115; 324/127
[51] Int. Cl.² ................ G01R 15/00; G01R 15/08
[58] Field of Search ......... 324/127, 126, 129, 115, 324/158 R, 73 R; 336/107, 229

[56] References Cited

UNITED STATES PATENTS

| 1,126,286 | 1/1915 | Roller | 324/127 |
|---|---|---|---|
| 2,831,164 | 4/1958 | Johnson | 324/127 |

OTHER PUBLICATIONS

Triplett Catalog 58-T; 1972; Triplett Corp.; Bluffton, Ohio 45817.
Amprobe Cat. A583; Pyramid Instrument Corp., Lynbrook, N.Y. 1958; pp. 1–4.
"Broader Information..."; Hewlett-Packard Journal; Nov.–Dec. 1961; pp. 1–4.

Primary Examiner—R. V. Rolinec
Assistant Examiner—Ernest F. Karlsen
Attorney, Agent, or Firm—Frederick P. Weidner; Francis H. Boos

[57] ABSTRACT

An electrical test device and method for use in checking current carrying circuitry by an AC current measuring hook-on meter having a magnetic core for magnetic coupling to the circuit being measured. The test device includes the electrical current carrying conductor means to be tested and support means upon which the conductor means is wound and through which the magnetic core of the hook-on meter may be placed. The test device and method is utilized for more easily and accurately performing a checkout of the circuitry and is particularly useful in connection with appliances.

8 Claims, 4 Drawing Figures

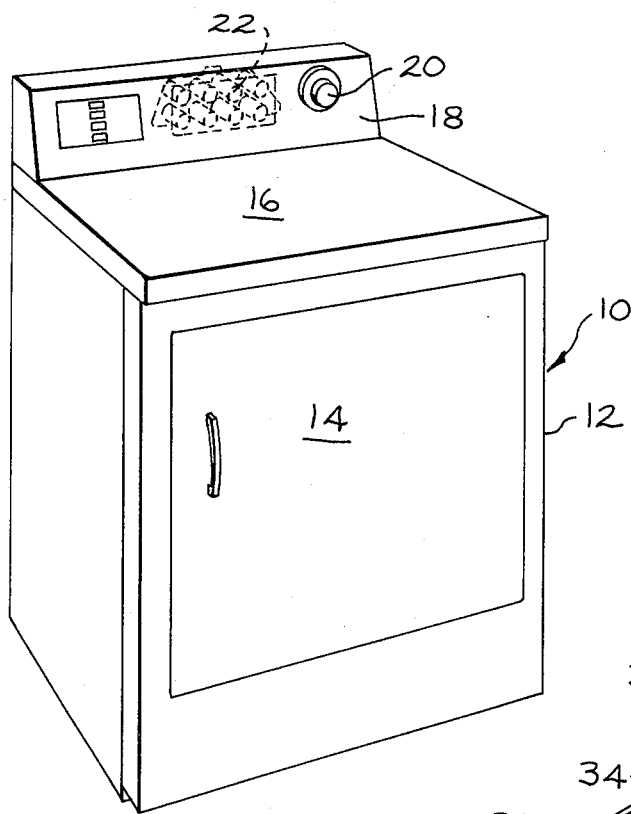
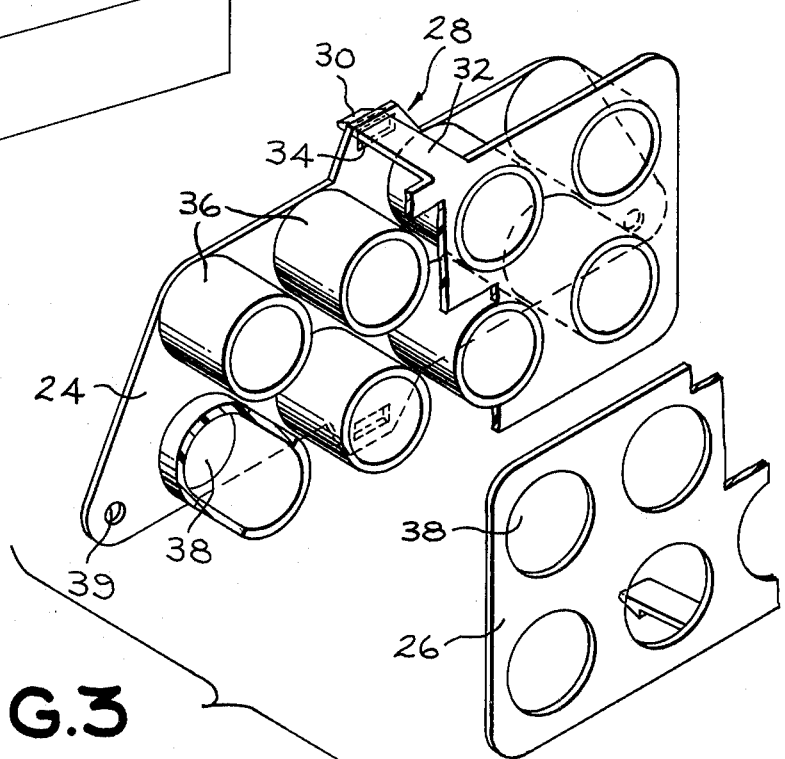
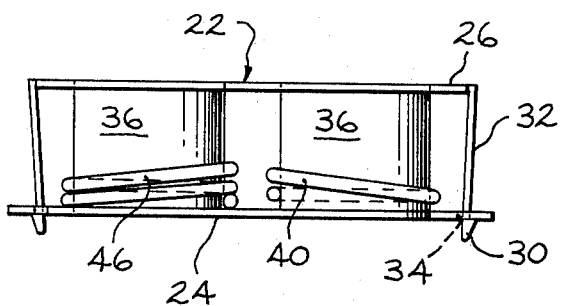

TEST DEVICE AND METHOD OF CHECKING CIRCUITRY

BACKGROUND OF THE INVENTION

1. Field of the Invention

This invention relates to an electrical test device for and method of checking current carrying circuitry, and more particularly to an electrical test device and method for utilization in connection with an appliance such as an automatic laundry machine so that current carrying circuitry of the machine may be checked.

2. Description of the Prior Art

In appliances such as clothes dryers and clothes washers, the current carrying circuitry of the machine which functions to operate the various components of the machine needs to be electrically tested by measuring the electrical current in order to determine whether or not the various components operated by the electrical system are functioning correctly. During assembly of the machine various components are added at various stages of machine assembly and when the machine is completed the electrical circuitry and the proper operation of the machine needs to be checked. In addition, any subsequent repair of the machine required in the field by a service repairman can often have the malfunction detected by testing the current carrying characteristics of the circuitry of that particular machine.

Testing the current carrying characteristics of the circuitry is often done by means of a hook-on volt-ammeter which is designed for magnetic coupling to the circuit being measured. These hook-on meters are well known in the art, are available commercially, and have widespread use in electrical testing. The use of such a hook-on meter in checking current carrying circuitry is shown in U.S. Pat. No. 2,266,624 assigned to the same assignee as the present application. Heretofore, testing with such hook-on meter often required manipulation or disruption of the circuitry that could cause loose terminals or connections. Alligator clips were often necessary, as shown in U.S. Pat. No. 2,266,624, which was difficult and a time consuming operation. Moreover, in many cases the current carrying conductors of the circuitry are difficult to identify and the assembly technician or service repairman checking the circuitry has to be extremely knowledgeable regarding what conductors are to be checked and what the meter readings should be for those conductors.

By my invention there is provided a test device and method for utilizing a hook-on meter that does not disrupt or manipulate circuitry and the conductors to be checked are easily and readily identifiable thus making the checkout more reliable. In addition the amount of time of the checkout can be reduced due to this simplified test device and method.

SUMMARY OF THE INVENTION

There is provided an electrical test device and method for use in checking current carrying circuitry by an AC current measuring hook-on meter having a magnetic core for magnetic coupling to the circuit being measured. The test device includes the electrical current carrying conductor means of the circuitry to be tested and support means upon which the conductor means is wound and through which the magnetic core of the hook-on meter may be placed. There is also provided electrically insulated material between the conductor means that is being tested and the magnetic core of the hook-on meter.

BRIEF DESCRIPTION OF THE DRAWINGS

FIG. 1 is a perspective view of a laundry machine such as an automatic clothes dryer showing the electrical test device located inside the control panel of the machine.

FIG. 3 is a perspective view of the test device with part of the cover shown broken away.

FIG. 4 is an enlarged side elevational cross-sectional view of the test device of FIG. 3.

DESCRIPTION OF THE PREFERRED EMBODIMENT

Figure 2:
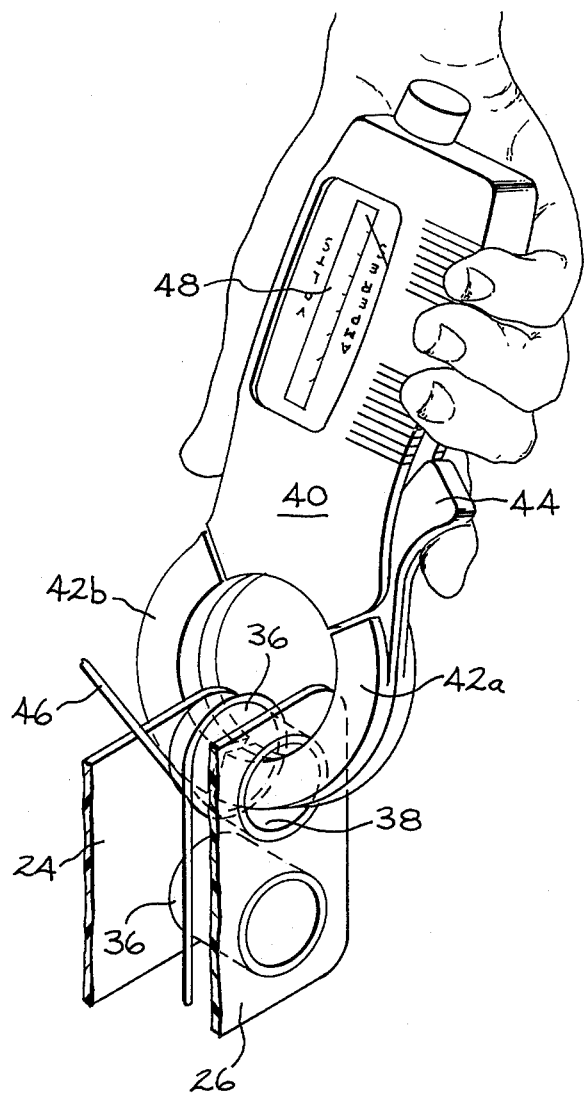
FIG. 2 is a perspective view of a hook-on meter showing it in position for taking a reading of a conductor being tested.

Referring now to FIG. 1, there is shown a laundry appliance 10 which in this case is illustrated as an automatic clothes dryer. The appliance is provided in the usual way with a cabinet 12 having a front door 14 to provide access to the interior of the cabinet for loading and unloading clothes. Mounted on the top wall 16 of cabinet 12 is a control panel or housing 18 which may include a suitable manual control member 20 connected to a conventional sequence control assembly (not shown). By manually setting of control 20 the machine is caused to start and automatically proceed through a cycle of operation.

Within the cabinet 12 there is a horizontal axis rotatable drum which constitutes the chamber for receiving clothes to be dried and a means for rotating the drum such as an electric motor connected to the drum by a belt drive and means for causing a flow of heated air to be passed through the drum while the clothes are being tumbled and dried.

Since most of the electrical current carrying circuitry of the appliance is located in the control housing 18 the test device 22 may conveniently be located within the control housing, however, the test device could be located elsewhere, if so desired.

With reference to FIGS. 3 and 4, the preferred structural arrangement of the test device is shown. The device includes a bottom plate 24 and a top removable plate 26. Plates 24 and 26 are not required but they do contribute to strengthening the device as well as other advantages. Top removable plate 26 may be secured in place to the bottom plate 24 by a latch assembly 28 which consists of a hook 30 connected to the top removable plate 26 by an elongated tang 32. This elongated tang is flexible to allow disengagement of the hook portion 30 from its position through opening 34 provided in the bottom plate 24. It will be noted that such a latch arrangement may be provided on both sides of the test device for structural stability.

Upstanding from bottom plate 24 is at least one, and in the embodiment shown, a plurality of open-ended cylindrical members 36 which when properly placed are sandwiched between the bottom plate 24 and the top removable plate 26 and provide the support means for receiving the conductor means wound thereon and through which the magnetic core of the hook-on meter is placed. Conveniently these open-ended cylindrical members 36 may be secured to a support plate, such as the bottom plate 24. In addition, preferably the entire test device is made of electrical insulating materials, such as suitable plastic, so that in manufacture of the test device the open-ended cylindrical members 36 and bottom plate 24 may be integrally molded thereby securing each to the other. It should be noted that both the bottom plate and top removable plate 26 are provided with holes 38 that are in register with the open-ended cylindrical members so that, as will be discussed later, the magnetic core of a hook-on meter may be passed completely therethrough. That is, completely through the top plate 26, open-ended members 36, and bottom plate 24. The openings 38 in the top plate are slightly larger in diameter than the outside diameter of the cylindrical members 36 so that the top plate may fit down over the members 36 again for structural stability. While the preferred embodiment as shown in the drawings utilizes an open-ended cylindrical member 36 as the support means for receiving the conductor thereon and the magnetic core of the meter therethrough, these support means may be of other configurations and still achieve the same results. For instance, the support means does not need to be solid walled or cylindrical in shape. It could consist of spaced pins if desired. However, the open-ended cylindrical member shape is easy to manufacture and the conductor is readily receivable thereon and the magnetic core of the meter accommodated therethrough.

While the test device does not need to be secured to a stationary member for it to function as desired, it preferably is secured for retention in its proper place. For retention purposes, such as in an appliance, means may be provided, in this case in the bottom plate 24, for securing the test device 22 to a rigid structural member within the control housing 18. Holes 39 are provided for accepting securing screws therethrough for fastening the test device 22 to a structural member inside the control housing 18.

The number of open-ended support members that are provided for the support means can vary depending upon the number of conductors of the conductor means in the current carrying circuitry that supply the different electrical loads and which are desired to be checked. In the drawings, as shown in the FIG. 3, there are eight open-ended support members, however, this can vary from one to any number. Each conductor of the circuitry to be tested is wound a specified number of times on at least one of the open-ended support members. While it is contemplated that in the preferred embodiment each electrical conductor to be tested is wound or looped completely around each member at least once it may not be necessary in all cases. When reference is made to the conductor being wound on the support means or member 36 it means that it assumes a condition on the support means that would be suitable for receiving the magnetic core of the hook-on meter to surround the turns for an accurate reading. Many times all that is needed for such a reading by a hook-on meter is for the conductor to pass through the magnetic core of the meter. It will be recognized, however, that to better maintain the electrical conductor in its proper position and secured in place that preferably the conductor will be wound at least once completely around the open-ended support member. A single conductor or a plurality of conductors of the conductor means may be wound on a single open-ended support member or on a plurality of support members. Depending upon the diagnostic test results desired, the multiple conductors may have their current measured individually by sequential current energization or interrelated composite currents may be measured simultaneously.

In most cases the hook-on meter will measure current through a single winding of the conductor as shown on the open-ended support member on the right in FIG. 4 and in FIG. 2, however, when measurements are quite small it may be desirable to increase the current value to be read by placing several turns of the conductor on the open-ended support member, as shown on the open-ended support member on the left in FIG. 4. The number of turns is determined by the diagnostic checkout program established for the particular electrical circuitry conductors to be checked and then wound on the open-ended support members 36 during assembly.

In operation, when it is desirable to check the current carrying circuitry, such as for the machine 10, the technician or service repairman removes the control housing 18 thus exposing the test device and the conductor means wound thereon. Voltage is applied to the circuitry, such as 115 volts AC, 60 C.P.S. in any convenient manner. In the case of checking the circuitry of a machine or appliance it simply is plugged into a receptacle as for normal operation. Then with a conventional electromagnetic volt-amperes hook-on meter 40 which is shown in FIG. 2 he opens the magnetic core jaws 42a and 42b by depressing lever 44 while placing the open jaws 42a and 42b at the open ends of support member 36 and then releasing the lever which by a spring action closes the jaws to form a magnetic core magnetically coupled with the conductor 46 which is wound around the outside surface of open-ended support member 36. To achieve this magnetic coupling the conductor 46 should be electrically insulated from the jaws 42a and 42b of the meter. Normally the conductor is coated with such an insulator material which would be sufficient, however, in addition I preferably construct the open-ended member 36 also from electrically insulated material. A moldable plastic which is suitable for the environment in which it will be utilized would be quite satisfactory. Once the hook-on meter is in place the meter will register on an indicator dial 48 the AC current value. This reading then is checked against the service manual recommendations for the corresponding conductors being checked as established by the diagnostic checkout program. This test device may have the open-ended support members 36 coded for the respective conductor wound thereon and conveniently indexed to the test program in the service manual for its normal functioning value. When the conductor has been checked the meter is removed by opening the jaws 42a and 42b again by depressing lever 44 and placed in the same manner into the next open-ended support member having a conductor to be checked and that current measurement taken. It is contemplated that with this test device and method of checking current carrying circuitry that the conductor means could have their current measurements taken either sequentially or simultaneously by a multiple hook-on meter device. This would particularly be the case during assembly of a machine when the circuitry is to be checked as a quality control step during assembly. It will be noted from the above-described test device and method of testing current carrying circuitry that a simplified test operation is accomplished. Namely, there has been eliminated any need to disrupt or manipulate the conductor means of the circuitry to be tested, or the disturbance of their terminals which could cause possible faulty connections. Moreover, a great amount of time is saved by this test device in accomplishing the overall checking of the current carrying circuitry as there is no need to connect and disconnect any clips for taking the current measurement. Also, the checkout procedure is greatly simplified by the manufacturer prelocating the correct conductor means for testing by the technician or service repairman and identifying those conductor means by coding the open-ended support members upon which they are wound. All of this is accomplished yet the test device is quite inexpensive, simple to manufacture and is easily installed in the circuitry to be tested.

The foregoing is a description of the preferred embodiment of the invention and variations may be made thereto without departing from the spirit of the invention, as defined in the appended claims.

What is claimed is:

1. An electrical test device for use in checking current carrying circuitry with an AC current measuring hook-on meter having a magnetic core wherein the test device is permanently installed on an electrical machine having a plurality of electrical conductors supplying a plurality of different electrical loads, said test device comprising: a plurality of hollow support members each supporting a set of windings, each set having a specified number of turns of at least one of the electrical conductors, and means permanently attaching the hollow support members on the electrical machine, the plurality of support members being supported in such a manner as to allow the core structure of a hook-on meter to surround the turns to provide the current measurements.

2. The electrical test device of claim 1 wherein the support members are hollow, open-ended cylindrically shaped support members dimensioned to receive the magnetic core of the meter therethrough.

3. The electrical test device of claim 1 wherein said hollow open-ended support members are mounted on a support plate.

4. The electrical test device of claim 1 wherein said hollow open-ended support members are made of electrically insulated material.

5. A method of checking the current carrying circuitry of an electrical machine having a plurality of electrical conductors with an AC current measuring hook-on meter having a magnetic core comprising the steps of:
    a. forming a plurality of hollow support members,
    b. supporting a set of windings on each support member, each set having a specified number of turns of at least one of the electrical conductors,
    c. attaching permanently the hollow support members on the electrical machine,
    d. placing the magnetic core of the hook-on meter through each of said support members to surround the turns thereon,
    e. reading the current measurements shown on the meter, and
    f. removing the meter from said support members.

6. The method of claim 5 wherein the support members are hollow open-ended cylindrically shaped support members dimensioned to receive the magnetic core of the meter therethrough.

7. The method of claim 5 wherein said hollow open-ended support members are mounted on a support plate.

8. The method of claim 5 wherein said hollow open-ended support members are made of electrically insulated material.

* * * * *